US008450855B2

(12) United States Patent
Seta et al.

(10) Patent No.: US 8,450,855 B2
(45) Date of Patent: May 28, 2013

(54) SEMICONDUCTOR DEVICE

(75) Inventors: Shoji Seta, Tokyo (JP); Hideaki Ikuma, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 13/047,042

(22) Filed: Mar. 14, 2011

(65) Prior Publication Data

US 2011/0298127 A1  Dec. 8, 2011

(30) Foreign Application Priority Data

Jun. 3, 2010  (JP) ................................. 2010-127947

(51) Int. Cl.
*H01L 23/48* (2006.01)
*H01L 23/52* (2006.01)

(52) U.S. Cl.
USPC ..... 257/773; 257/786; 257/780; 257/E23.021

(58) Field of Classification Search
USPC .......................... 257/773, 786, 780, E23.021
See application file for complete search history.

(56) References Cited

U.S. PATENT DOCUMENTS

| 7,538,442 | B2 * | 5/2009 | Nakanishi et al. ............. 257/786 |
| 7,710,107 | B2 * | 5/2010 | Cochran .................. 324/207.11 |
| 8,101,433 | B2 * | 1/2012 | Akiba et al. .................... 438/15 |
| 2005/0067696 | A1 * | 3/2005 | Terasaki ........................ 257/724 |
| 2007/0075424 | A1 | 4/2007 | Nakanishi et al. |
| 2009/0212425 | A1 * | 8/2009 | Ito et al. ........................ 257/737 |
| 2009/0243118 | A1 * | 10/2009 | Akiba et al. .................. 257/773 |
| 2010/0181650 | A1 * | 7/2010 | Shigihara et al. ............. 257/620 |
| 2011/0042833 | A1 * | 2/2011 | Komiya ........................ 257/786 |
| 2012/0133058 | A1 * | 5/2012 | Komiya ........................ 257/786 |

FOREIGN PATENT DOCUMENTS

| JP | 09-199535 | 7/1997 |
| JP | 2003-092375 | 3/2003 |
| JP | 2007-103539 | 4/2007 |

OTHER PUBLICATIONS

Office Action (with English translation) for Japanese Patent Application No. 2010-127947, mailed Feb. 22, 2013, 5 pages.

* cited by examiner

*Primary Examiner* — Nitin Parekh
(74) *Attorney, Agent, or Firm* — Sprinkle IP Law Group

(57) ABSTRACT

A semiconductor device has a semiconductor substrate which has a plurality of pad electrodes provided on a top surface thereof and has an approximately rectangular shape; a rewiring layer which is provided with a plurality of contact wiring lines connected to the plurality of pad electrodes, is disposed on the semiconductor substrate through an insulating film, and has an approximately rectangular shape; and a plurality of ball electrodes which are provided on the rewiring layer. A plurality of first pad electrodes among the plurality of pad electrodes are arranged on an outer circumference of the semiconductor substrate to be along a first side of the semiconductor substrate, a plurality of first ball electrodes among the plurality of ball electrodes are arranged on an outer circumference of the rewiring layer to be along the first side, and any one of the plurality of first ball electrodes is connected to the first pad electrode positioned below the corresponding ball electrode through the contact wiring lines, and the first pad electrodes are not disposed on the lower side of the first ball electrodes positioned at an end of the first side.

13 Claims, 10 Drawing Sheets

SEMICONDUCTOR DEVICE

CROSS-REFERENCE TO RELATED APPLICATION

This application is based upon and claims the benefit of priority from the prior Japanese Patent Application No. 2010-127947, filed on Jun. 3, 2010, the entire contents of which are incorporated herein by reference.

BACKGROUND

1. Field

Embodiments described herein relate generally to a semiconductor device where a wafer level chip size package (WCSP) is applied.

2. Background Art

In the conventional art, since a rewiring layer of a WCSP is one layer, wiring becomes difficult, as compared with a multilayered substrate, such as a ball grid array (BGA).

For this reason, according to the layout of pads, there exist a signal line, a power supply, and a ground that may not be connected. As a result, it becomes difficult to manufacture a large scale integration (LSI).

DETAILED DESCRIPTION

A semiconductor device according to an embodiment, includes a semiconductor substrate which has a plurality of pad electrodes provided on a top surface thereof and has an approximately rectangular shape; a rewiring layer which is provided with a plurality of contact wiring lines connected to the plurality of pad electrodes, is disposed on the semiconductor substrate through an insulating film, and has an approximately rectangular shape; and a plurality of ball electrodes which are provided on the rewiring layer. A plurality of first pad electrodes among the plurality of pad electrodes are arranged on an outer circumference of the semiconductor substrate to be along a first side of the semiconductor substrate, a plurality of first ball electrodes among the plurality of ball electrodes are arranged on an outer circumference of the rewiring layer to be along the first side, and any one of the plurality of first ball electrodes is connected to the first pad electrode positioned below the corresponding ball electrode through the contact wiring lines, and the first pad electrodes are not disposed on the lower side of the first ball electrodes positioned at an end of the first side.

Hereafter, embodiments will be described on the basis of the drawings.

[First Embodiment]

Figure 1:
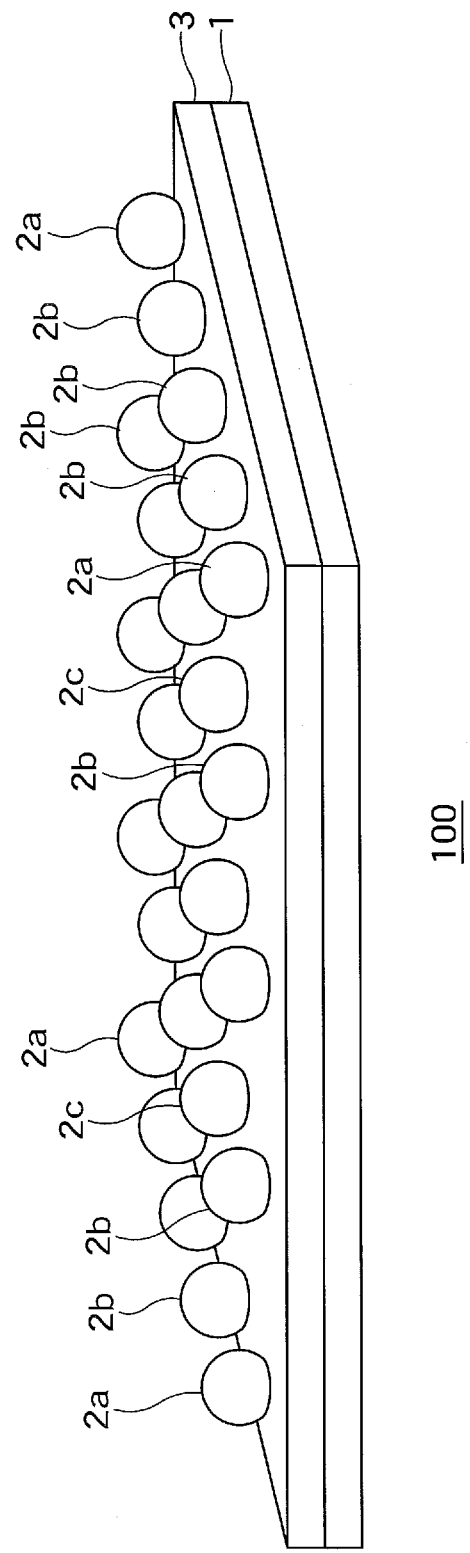
FIG. 1 is a diagram showing an example of the configuration of a semiconductor device 100 according to a first embodiment.
Figure 2:
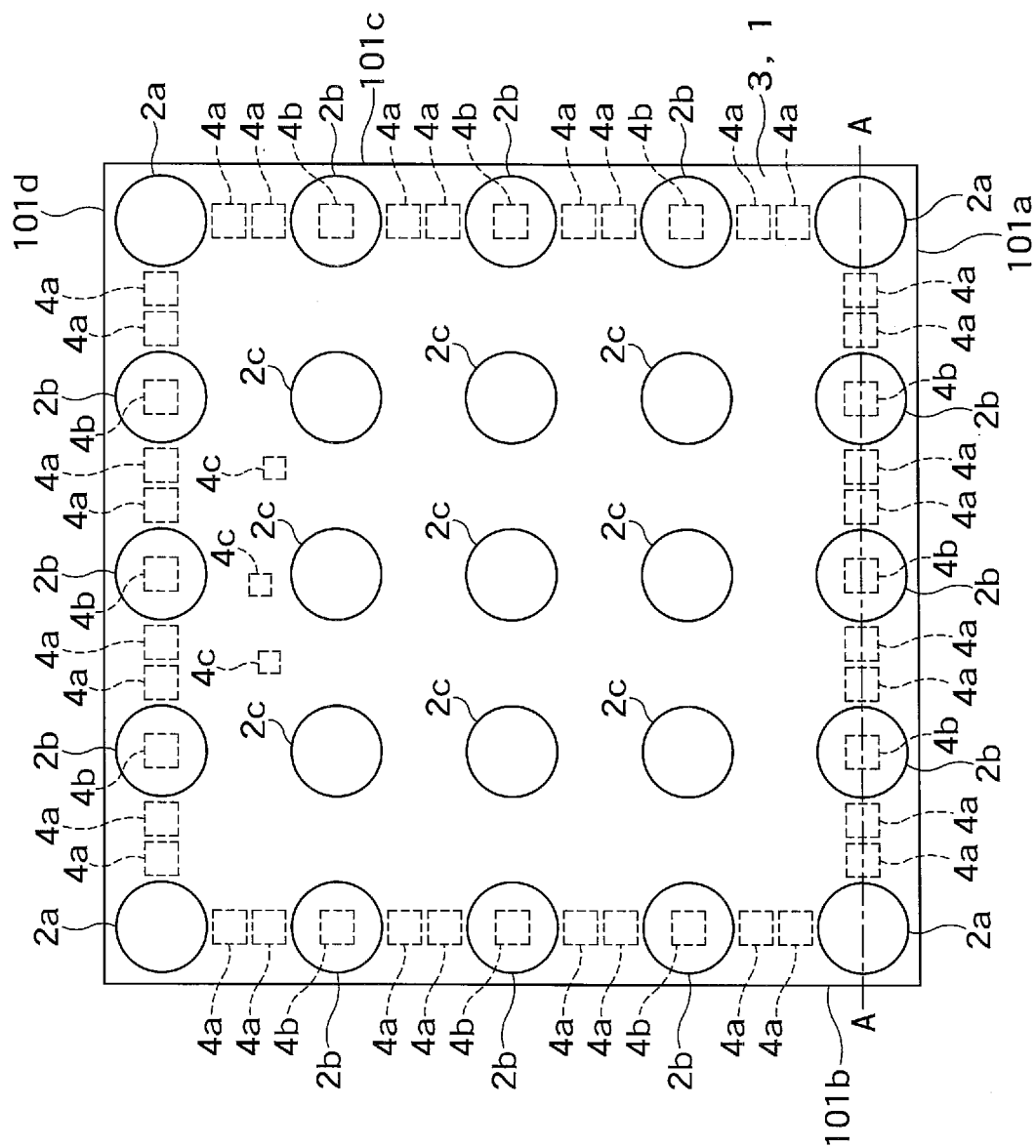
FIG. 2 is a top view showing an example of the case where the semiconductor device 100 shown in FIG. 1 is viewed from the upper side.
Figure 3:
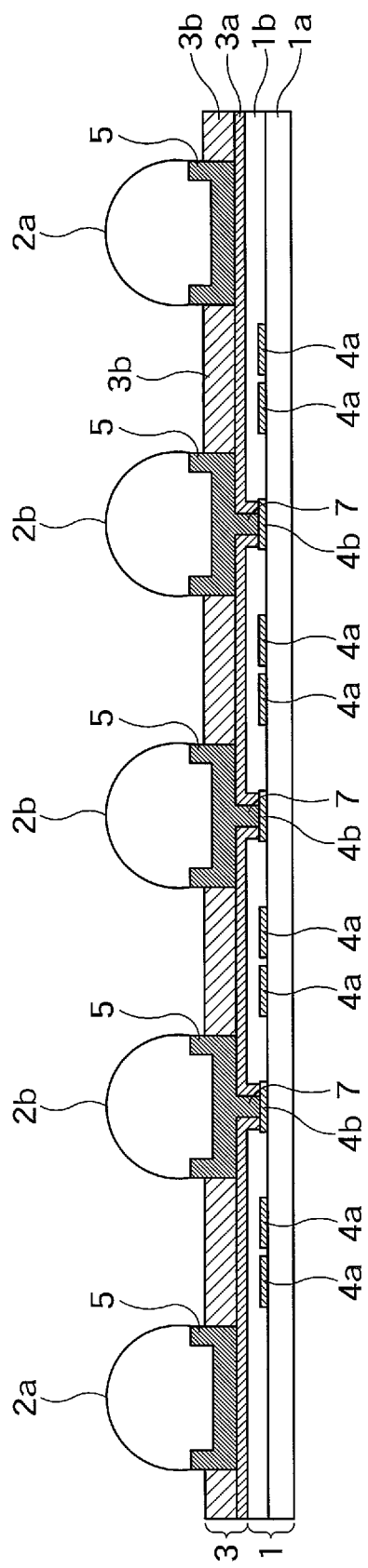
FIG. 3 is a cross-sectional view showing an example of a section of the semiconductor device 100 taken along the line A-A of FIG. 2.
Figure 4:
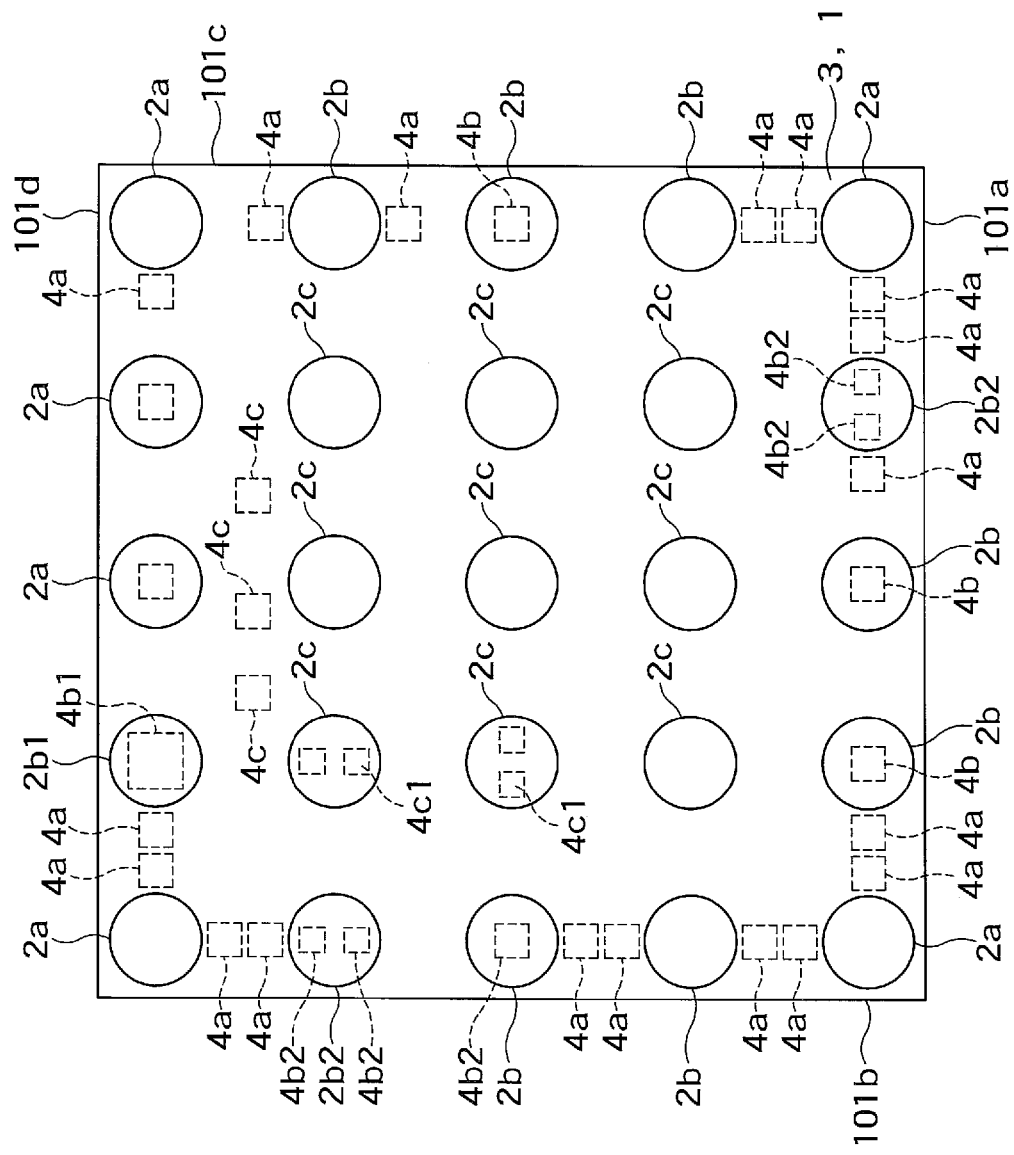
FIG. 4 is a top view showing another example of the case where the semiconductor device 100 shown in FIG. 1 is viewed from the upper side.

FIG. 1 is a diagram showing an example of the configuration of a semiconductor device 100 according to a first embodiment. FIG. 2 is a top view showing an example of the case where the semiconductor device 100 shown in FIG. 1 is viewed from the upper side. FIG. 3 is a cross-sectional view showing an example of a section of the semiconductor device 100 taken along the line A-A of FIG. 2. FIG. 4 is a top view showing another example of the case where the semiconductor device 100 shown in FIG. 1 is viewed from the upper side.

As shown in FIGS. 1 to 3, the semiconductor device 100 includes an LSI substrate 1 that has an approximately rectangular shape, a rewiring layer 3 that has an approximately rectangular shape, and plural ball electrodes (bumps) 2a, 2b, and 2c.

In the LSI substrate 1, a semiconductor integrated circuit (not shown in the drawings) is formed. The LSI substrate 1 has a semiconductor substrate 1a that has an approximately rectangular shape, an insulating film 1b, and plural pad electrodes 4a, 4b, and 4c that are connected to the semiconductor integrated circuit.

On a top surface of the semiconductor substrate (for example, silicon substrate) 1a, the plural pad electrodes 4a, 4b, and 4c are provided, and are connected to the semiconductor integrated circuit.

The insulating film 1b is provided on the semiconductor substrate 1a and covers the semiconductor integrated circuit and the plural pad electrodes 4a, 4b, and 4c.

Among the plural pad electrodes 4a, 4b, and 4c, the plural first pad electrodes 4a and 4b are arranged on the outer circumference of the semiconductor substrate 1a to be along first to fourth sides 101a to 101d of the semiconductor substrate 1a parallel to a substrate surface of the semiconductor substrate 1a.

For example, the pad electrodes 4a and 4c are connected to the ball electrodes 2a and 2c through rewiring lines (not shown in the drawings). In this case, the two pad electrodes 4a are disposed between the ball electrodes 2a and 2b. However, the number of pad electrodes may be changed according to necessity.

The pad electrode 4c is connected to an intellectual property core (IP core) (not shown in the drawings) that is disposed on the central side of the LSI substrate 1. The pad electrode 4c is disposed on the central side of the LSI substrate 1 to reduce the amount of wiring lines of the outer circumference or an upper layer.

The rewiring layer 3 includes polyimide films (resin films) 3a and 3b that are provided on the insulating film 1b, a connecting electrode 5 for a flip chip, and a contact wiring line 7.

The rewiring layer 3 is provided on the semiconductor substrate is through the insulating film 1b. In the rewiring layer 3, plural contact wiring lines (vias) 7 that are connected to the plural pad electrodes 4b are provided.

The connecting electrode 5 is disposed between the first ball electrode 2b and the contact wiring line 7 and electrically connects the first ball electrode 2b and the contact wiring line 7.

The plural ball electrodes (bumps) 2a, 2b, and 2c are provided in a matrix on the rewiring layer 3 and an interval thereof is about 0.4 mm. However, the plural ball electrodes (bumps) 2a, 2b, and 2c may not be disposed in the matrix and the interval thereof may be changed according to necessity.

Among the plural ball electrodes 2a, 2b, and 2c, the plural first ball electrodes 2a and 2b are arranged on the outer circumference of the rewiring layer 3 to be along the first to fourth sides 101a to 101d.

The ball electrode 2b of the plural first ball electrodes 2a and 2b is connected to the first pad electrode 4b of the lower side of the plural first pad electrodes 4a and 4b through the connecting electrode 5 and the contact wiring line 7.

As such, by disposing the pad electrode 4b on the lower side of the ball electrode 2b, the wiring capacitance is decreased. For this reason, by applying a high-speed input/output signal having a frequency of 10 MHz or more, an influence of crosstalk noise from the rewiring layer to other signals can be reduced.

An area of a bottom surface of the connecting electrode 5 is set to be larger than an area of a top surface of the first pad electrode 4b. The area of the bottom surface of the connecting electrode 5 is set to be larger than an area of a top surface of the contact wiring line 7 connected to the bottom surface of the connecting electrode 5. An area of a bottom surface of the first pad electrode 4b is set to be larger than the area of the top surface of the contact wiring line 7.

Thereby, reliability of electric connection of the connecting electrode 5, the contact wiring line 7, and the first pad electrode 4b can be improved.

The first pad electrode 4b is not disposed on the lower side of the first ball electrode 2a closest to an end of the first side 101a. Likewise, the first pad electrode 4b is not disposed on the lower side of the first ball electrodes 2a closest to ends of the second to fourth sides 101b to 101d. This follows conditions of ends of a tester to test the LSI formed on the wafer, and the pad electrode is not disposed on an end of the LSI substrate 1.

As such, the pad electrode 4b is disposed on the lower side of the ball electrode 2b of the WCSP and the pad electrodes that are connected to the other ball electrodes 2a and 2c are disposed between the ball electrodes 2a and 2b. Thereby, the amount of rewiring lines of the ball electrodes 2b that are disposed on the outer circumference can be reduced. Therefore, when the rewiring layer of the WCSP is formed, the rewiring lines can be formed without increasing the number of wiring layers.

Thereby, formation of the wiring lines in the WCSP is facilitated and an area of the LSI substrate 1 can be reduced. That is, yield per wafer can be improved and the number of chips per wafer can be increased.

As shown in FIG. 4, the two pad electrodes 4b2 for the ground or the power supply that are disposed along the first and second sides 101a and 101b may be disposed on the lower side of one ball electrode 2b2 disposed along the second side 101b to be connected to each other.

As shown in FIG. 4, the two pad electrodes 4c2 may be disposed on the lower side of one ball electrode 2c. In this case, the impedance between the pad electrodes 4c2 and the ball electrode 2c is reduced. Therefore, in the semiconductor device 100, the IR drop, the electro-migration, noise, etc. are reduced, and the ESD (electro static discharge) is suppressed. The three or more pad electrodes 4c2 may be electrically connected to one ball electrode 2c. As shown in FIG. 4, one pad electrode 4b1 for the ground or the power supply that is disposed along the fourth side 101d and has an area of a top surface larger than that of another pad electrode 4a may be disposed on the lower side of one ball electrode 2b1 disposed along the fourth side 101b to be connected to each other.

In this case, a contact area of the pad electrode and the contact electrode is preferably equal to or more than ⅔ of an area of a top surface of the pad, from a viewpoint of reliability. The three or more pad electrodes may be electrically connected to one ball electrode.

As shown in FIG. 4, the pad electrodes may not be disposed between the ball electrodes disposed along the first to fourth sides 101a to 101d of the LSI substrate 1, according to necessity.

As such, with the semiconductor device according to the first embodiment, the wiring lines of the rewiring layer can be easily formed while the chip size is reduced.

[Second Embodiment]

In the second embodiment, the rewiring lines for the ground or the power supply are examined and another example of the configuration of the semiconductor device where the wiring lines of the rewiring layer can be easily formed while the chip size is reduced is described. The entire configuration of the semiconductor device according to the second embodiment is the same as that of the semiconductor device 100 shown in FIG. 1.

Figure 5:
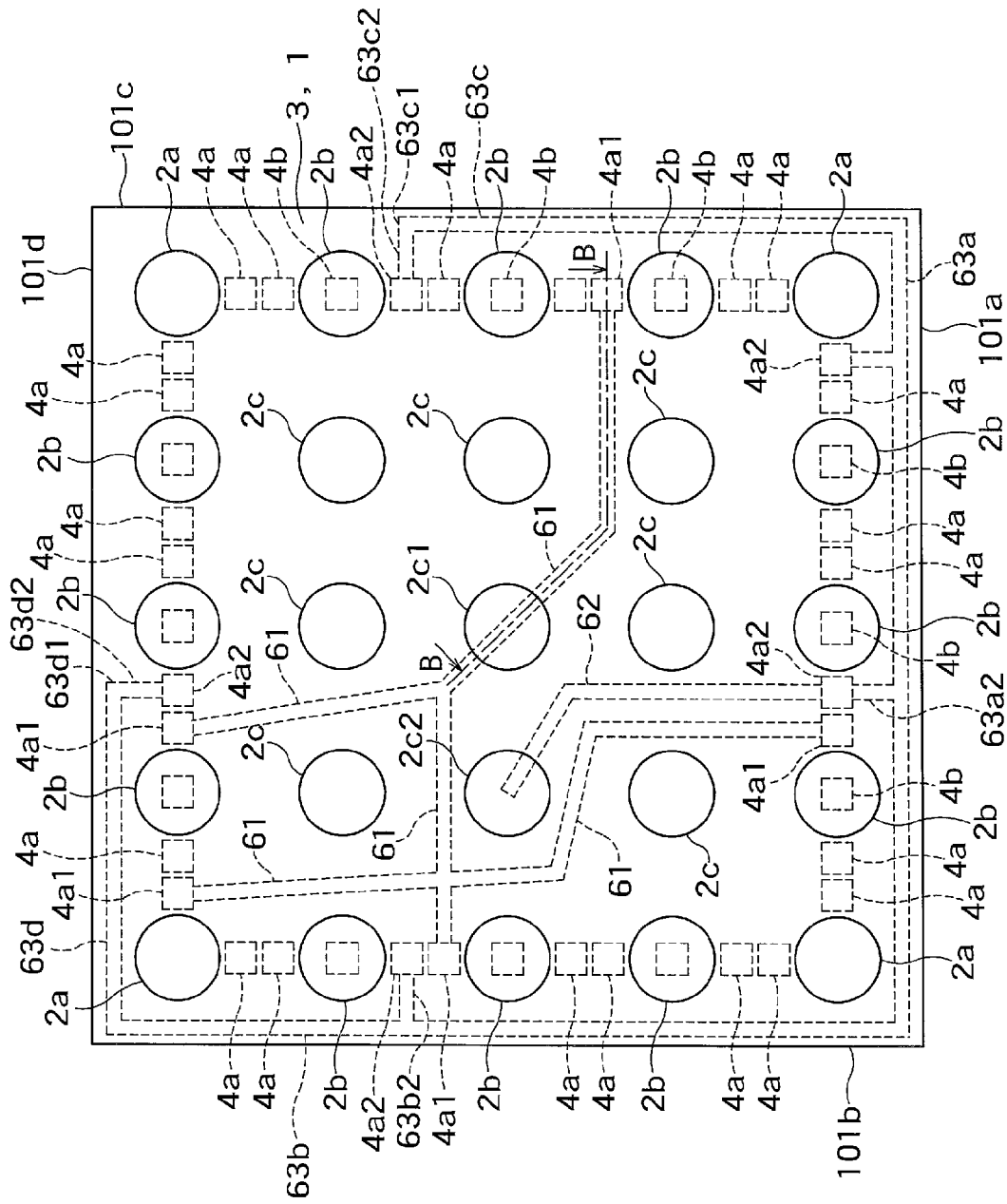
FIG. 5 is a top view showing another example of the case where the semiconductor device 100 shown in FIG. 1 is viewed from the upper side.
Figure 6:
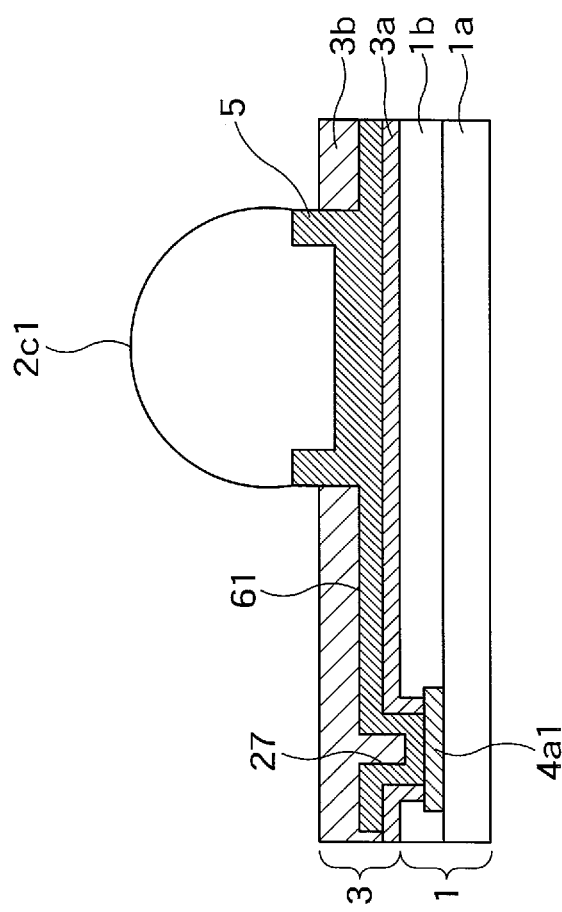
FIG. 6 is a cross-sectional view showing an example of a section of the semiconductor device 100 taken along the line B-B of FIG. 5.

FIG. 5 is a top view showing another example of the case where the semiconductor device 100 shown in FIG. 1 is viewed from the upper side. FIG. 6 is a cross-sectional view showing an example of a section of the semiconductor device 100 taken along the line B-B of FIG. 5. In FIGS. 5 and 6, the same reference numerals as those of FIGS. 1 to 3 denote the same components as those of the first embodiment.

As shown in FIGS. 5 and 6, in the second embodiment, the semiconductor device 100 further includes a first rewiring line 61, a second rewiring line 62, and outer circumference wiring lines 63a to 63d, as compared with the first embodiment.

The first rewiring line 61 is provided in the rewiring layer 3. The first rewiring line 61 electrically connects a second ball electrode 2c1 of plural ball electrodes 2a, 2b, 2c, 2c1, and 2c2 which is positioned at the central side on the rewiring layer 3 and is applied with a first voltage (which is one of a power supply voltage and a ground voltage, but the ground voltage in the second embodiment) VSS and any pad electrode 4a1 of plural first pad electrodes 4a, 4a1, 4a2, and 4b which is supplied with the first voltage VSS. The first rewiring line 61 and the pad electrode 4a1 are connected by a contact wiring line 27 (for example, refer to FIG. 6).

Similar to the first rewiring line 61, the second rewiring line 62 is provided in the rewiring layer 3. The second rewiring layer 62 connects the third ball electrode 2c2 of the plural ball electrodes 2a, 2b, 2c, 2c1, and 2c2, which is positioned at the central side on the rewiring layer 3 and is applied with a second voltage (which is the other one of the power supply voltage and the ground voltage, but the power supply voltage in the second embodiment) VDD different from the first voltage VSS, and any pad electrode 4a2 of the plural first pad electrodes 4a, 4a1, 4a2, and 4b which is supplied with the second voltage VDD.

The ball electrodes 2c1 and 2c2 are shown as the ball electrode 2c in FIG. 2 corresponding to the first embodiment.

Further, the first pad electrodes 4*a*1 and 4*a*2 are shown as the pad electrode 4*a* in FIG. 2 corresponding to the first embodiment.

The outer circumference wiring lines 63*a* to 63*d* are disposed on the outer circumference of the rewiring layer 3 along the first to fourth sides 101*a* to 101*d* to be positioned closer to the outside of the rewiring layer 3 than a region of the rewiring layer 3 of the upper side of the first pad electrodes 4*a* and 4*b*.

The outer circumference wiring lines 63*a* to 63*d* are connected to the pad electrode 4*a*2 through the wiring lines 63*a*2 to 63*d*2 provided in the rewiring layer 3. The outer circumference wiring lines 63*a* to 63*d* are connected to the second rewiring line 62 through the wiring line 63*a*2 provided in the rewiring layer 3. That is, the outer circumference wiring lines 63*a* to 63*d* are connected to the second rewiring line 62 through the first pad electrode 4*a*2 to be supplied with the second voltage VDD.

The outer circumference wiring lines 63*a* to 63*d* has both ends 63*c*1 and 63*d*1 in regions (regions along the third and fourth sides 101*c* and 101*d* in the second embodiment) other than a region along the first side 101*a*. Thereby, an influence of noise that is included in the power supply voltage (or ground voltage) can be reduced, as compared with the case where the outer circumference wiring lines are connected in a ring shape.

Since the resistance values of the outer circumference wiring lines 63*a* to 63*d* affect IR drop or power supply noise, the outer circumference wiring lines 63*a* to 63*d* preferably have the width (section area) larger than that of a common power supply or ground wiring line.

As such, by disposing the outer circumference wiring line becoming the power supply wiring line or the ground wiring line to be closer to the outer circumferential side of the rewiring layer 3 than the ball electrodes 2*a* and 2*b*, the power supply or ground rewiring line can be formed from the first to fourth sides 101*a* to 101*d* to the central side.

As described above, in the second embodiment, the outer circumference wiring lines 63*a* to 63*d* supply the power supply voltage. However, the outer circumference wiring lines 63*a* to 63*d* may supply the ground voltage, according to necessity.

In the configuration according to the second embodiment, the pad electrode 4*b* is disposed on the lower side of the ball electrode 2*b* of the WCSP and the pad electrodes that are connected to the other ball electrodes 2*a* and 2*c* are disposed between the ball electrodes 2*a* and 2*b*. Thereby, similar to the first embodiment, the amount of rewiring lines of the ball electrodes 2*b* that are disposed on the outer circumference can be reduced. Therefore, when the rewiring layer of the WCSP is formed, the rewiring lines can be formed without increasing the number of wiring layers.

Thereby, similar to the first embodiment, formation of the wiring lines in the WCSP is facilitated and an area of the LSI substrate 1 can be reduced. That is, yield per wafer can be improved and the number of chips per wafer can be increased.

As such, with the semiconductor device according to the second embodiment, the wiring lines of the rewiring layer can be easily formed while the chip size is reduced, similar to the first embodiment.

[Third Embodiment]

In the third embodiment, a connection relationship of ball electrodes where the ground voltage and the power supply voltage are applied and another example of the configuration of the semiconductor device where the wiring lines of the rewiring layer can be easily formed while the chip size is reduced are described. The entire configuration of the semiconductor device according to the third embodiment is the same as that of the semiconductor device 100 shown in FIG. 1.

Figure 7:
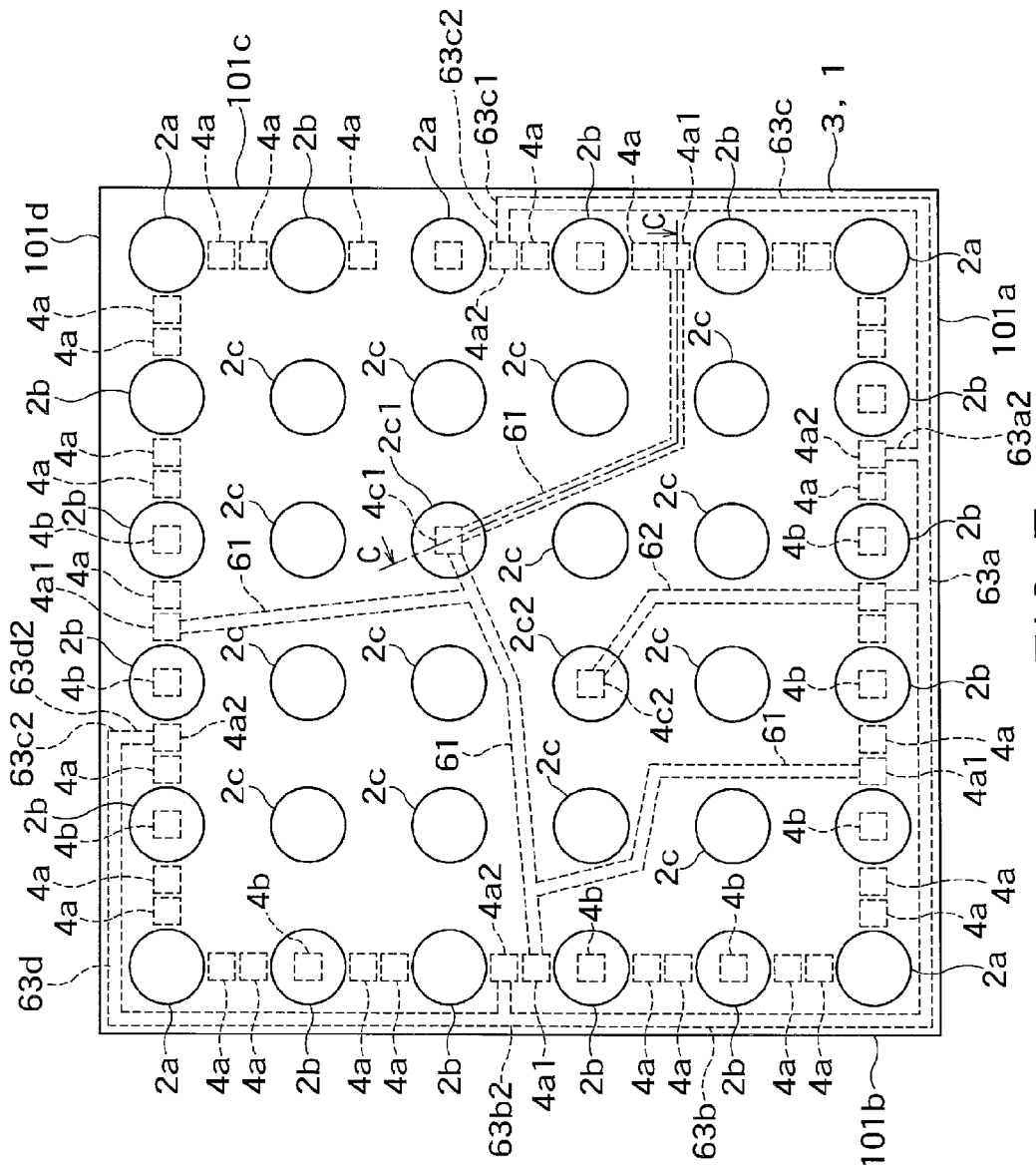
FIG. 7 is a top view showing another example of the case where the semiconductor device 100 shown in FIG. 1 is viewed from the upper side.
Figure 8:
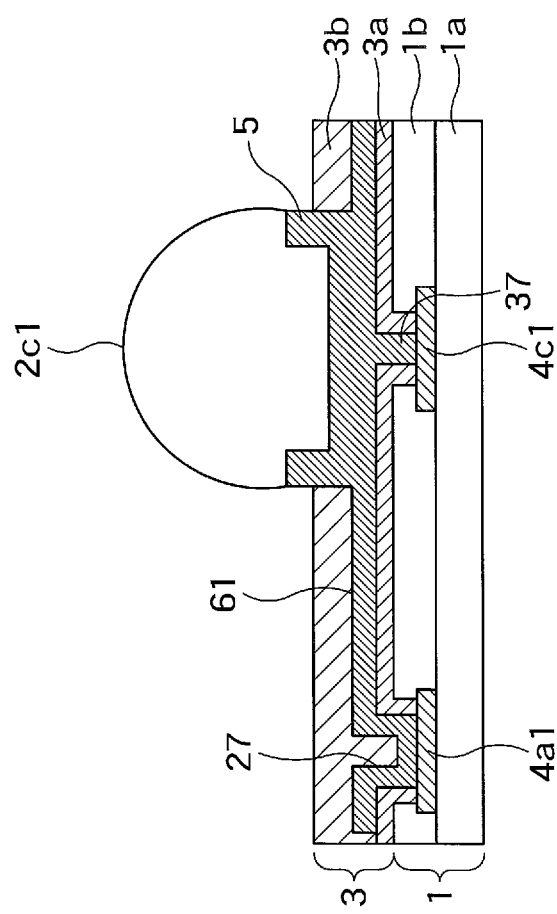
FIG. 8 is a cross-sectional view showing an example of a section of the semiconductor device 100 taken along the line C-C of FIG. 7.

FIG. 7 is a top view showing another example of the case where the semiconductor device 100 shown in FIG. 1 is viewed from the upper side. FIG. 8 is a cross-sectional view showing an example of a section of the semiconductor device 100 taken along the line C-C of FIG. 7. In FIGS. 7 and 8, the same reference numerals as those of FIGS. 5 and 6 denote the same components as those of the second embodiment.

As shown in FIGS. 7 and 8, in the third embodiment, the semiconductor device 100 is different from the semiconductor device according to the second embodiment in that the second ball electrode 2*c*1 is connected to the pad electrode 4*c*1 positioned on the lower side and to be supplied with the first voltage VSS, through the contact wiring line 37 and the connecting electrode 5, and the third ball electrode 2*c*2 is connected to the pad electrode 4*c*2 positioned on the lower side and to be supplied with the second voltage VDD, through the contact wiring line and the connecting electrode.

The pad electrodes 4*c*1 and 4*c*2 may be disposed at the positions shifted from the positions of the lower side of the second and third ball electrodes 2*c*1 and 2*c*2.

Figure 9:
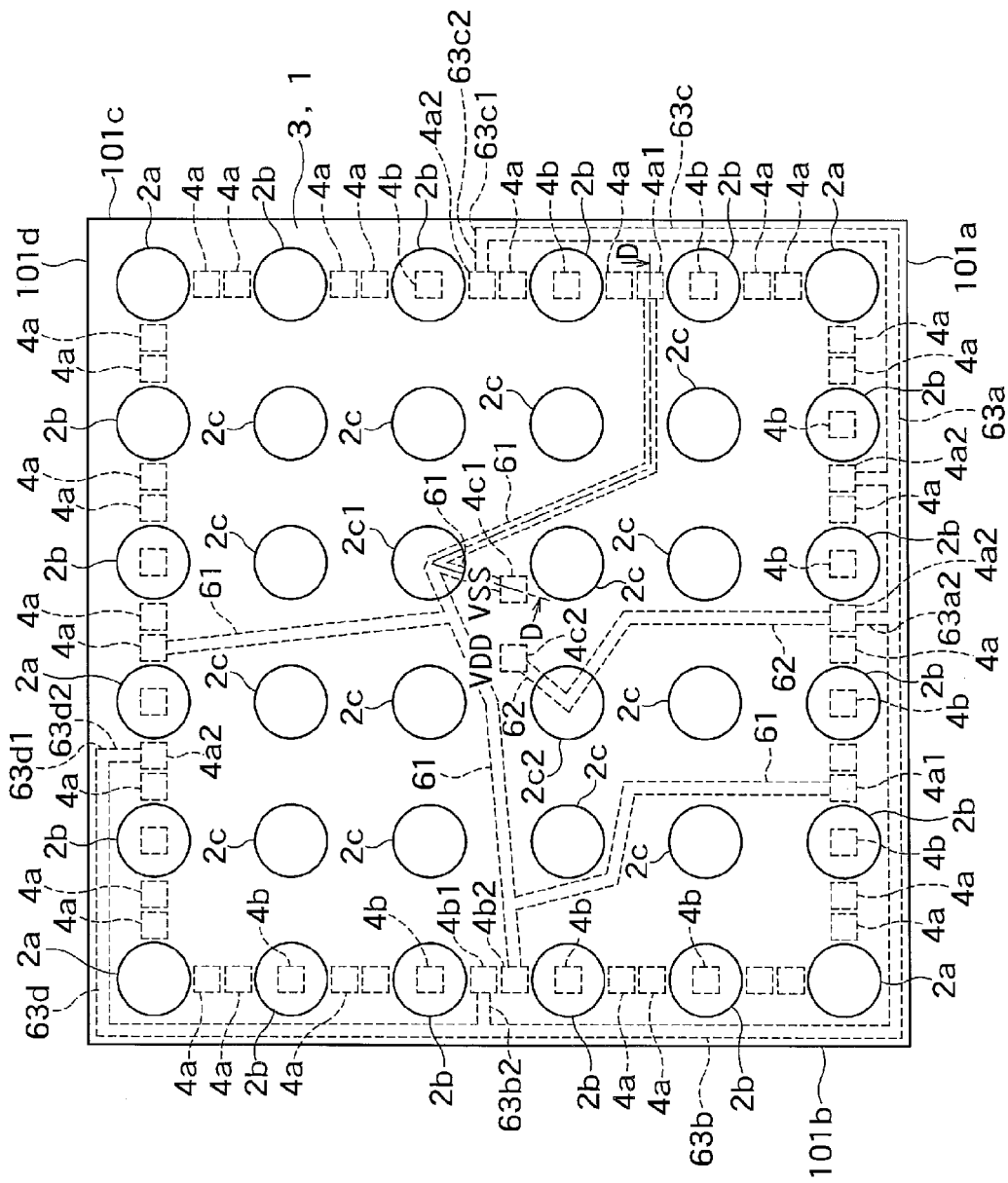
FIG. 9 is a top view showing another example of the case where the semiconductor device 100 shown in FIG. 1 is viewed from the upper side.
Figure 10:
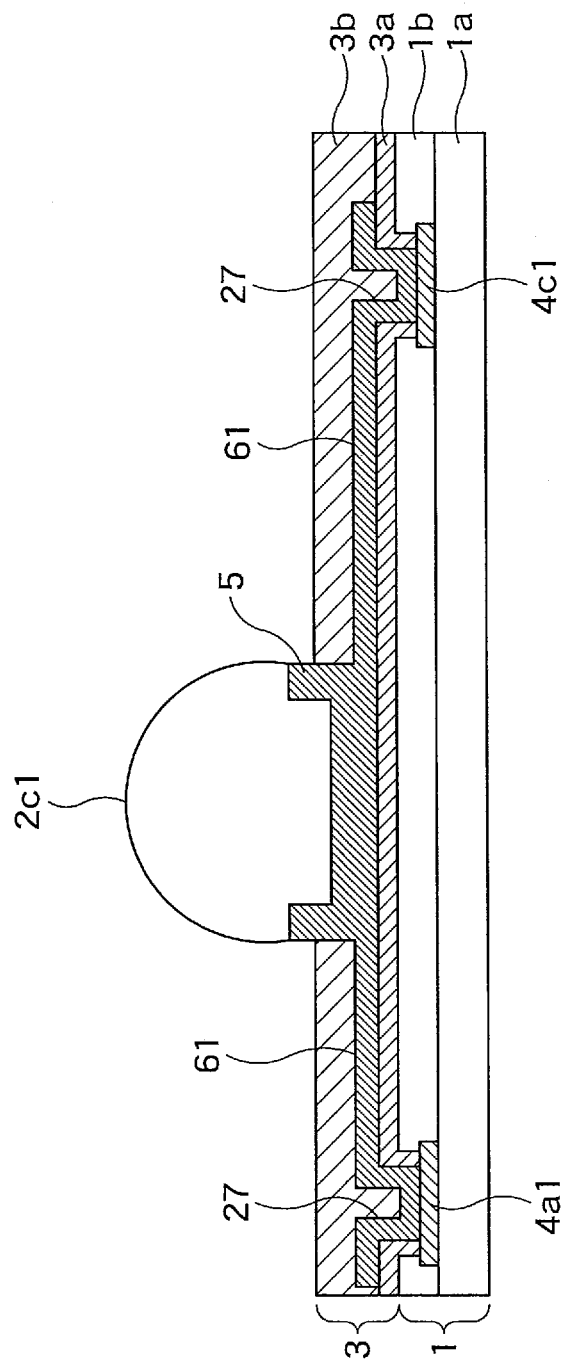
FIG. 10 is a cross-sectional view showing an example of a section of the semiconductor device 100 taken along the line D-D of FIG. 9.

FIG. 9 is a top view showing another example of the case where the semiconductor device 100 shown in FIG. 1 is viewed from the upper side. FIG. 10 is a cross-sectional view showing an example of a section of the semiconductor device 100 taken along the line D-D of FIG. 9. In FIGS. 9 and 10, the same reference numerals as those of FIGS. 5 and 6 denote the same components as those of the second embodiment.

As shown in FIGS. 9 and 10, in the third embodiment, the semiconductor device 100 is different from the semiconductor device according to the second embodiment in that the second ball electrode 2*c*1 is connected to the pad electrode 4*c*1 positioned to be apart from the lower side and to be supplied with the first voltage VSS, through the contact wiring line 37 and the connecting electrode 5, and the third ball electrode 2*c*2 is connected to the pad electrode 4*c*2 positioned to be apart from the lower side and to be supplied with the second voltage VDD, through the contact wiring line and the connecting electrode.

In this case, the wiring line is minute, the chip area increases, the width of the wiring line decreases and the length thereof increases, and the IR drop and the noise notably appear. In particular, the IR drop increases in the vicinity of the center of the rewiring layer 3.

Therefore, in the third embodiment, as described above, the ground and the power supply are connected to the ball electrodes 2*c*1 and 2*c*2 in the vicinity of the center, and the pad electrodes 4*c*1 and 4*c*2 for the power supply and the ground are disposed in the LSI substrate 1, on the lower side of the ball electrodes 2*c*1 and 2*c*2 or in the vicinity of the ball electrodes. Thereby, the power supply voltage VDD is supplied from the vicinity of the center of the rewiring layer 3 to the outer circumference, and the IR drop can be suppressed. In addition, the ground is in the vicinity of the center and a noise characteristic can be improved.

Both the pad electrodes 4*c*1 and 4*c*2 for the power supply and the ground do not need to be provided and only one of the pad electrodes for the power supply and the ground may be provided.

The case where the number of each of the pad electrodes 4*c*1 and 4*c*2 for the power supply and the ground is one is described. However, the number may be plural according to necessity.

In the configuration according to the third embodiment, the pad electrode 4*b* is disposed on the lower side of the ball electrode 2b of the WCSP and the pad electrodes that are connected to the other ball electrodes 2a and 2c are disposed between the ball electrodes 2a and 2b. Thereby, similar to the first embodiment, the amount of rewiring lines of the ball electrodes 2b that are disposed on the outer circumference can be reduced. Therefore, when the rewiring layer of the WCSP is formed, the rewiring lines can be formed without increasing the number of wiring layers.

Thereby, formation of the wiring lines in the WCSP is facilitated and an area of the LSI substrate 1 can be reduced, similar to the first embodiment. That is, yield per wafer can be improved and the number of chips per wafer can be increased.

As such, with the semiconductor device according to the third embodiment, the wiring lines of the rewiring layer can be easily formed while the chip size is reduced, similar to the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate which has a plurality of pad electrodes provided on a top surface thereof and has an approximately rectangular shape;
a rewiring layer which is provided with a plurality of contact wiring lines connected to the plurality of pad electrodes, is disposed on the semiconductor substrate through an insulating film; and
a plurality of ball electrodes which are provided on the rewiring layer,
wherein a plurality of first pad electrodes among the plurality of pad electrodes are arranged on an outer circumference of the semiconductor substrate to be along a first side of the semiconductor substrate,
a plurality of first ball electrodes among the plurality of ball electrodes are arranged on an outer circumference of the rewiring layer to be along the first side, and
one or more of the plurality of first ball electrodes is connected to the first pad electrode positioned directly below the corresponding ball electrode through the contact wiring lines, and the first pad electrodes are not disposed directly below the first ball electrodes positioned at an end of the first side, the semiconductor device further comprising:
outer circumference wiring lines to be disposed on the outer circumference of the rewiring layer along the first side, the outer circumference wiring lines being outside from the first pad electrodes in a plane parallel to the top surface of the substrate.

2. The semiconductor device of claim 1, further comprises a second ball electrode and a third ball electrode which are provided in a central region on the semiconductor substrate,
wherein a pad electrode applied with a first voltage, among the plurality of first pad electrodes, is connected to the outer circumference wiring line, the outer circumference wiring line being connected to the second ball electrode through a first rewiring line of the rewiring layer, and wherein a pad electrode applied with a second voltage, among the plurality of first pad electrodes, is connected to the third ball electrode through a second rewiring line of the rewiring layer.

3. The semiconductor device of claim 2, wherein the outer circumference wiring lines extend to sides other than the first side.

4. The semiconductor device of claim 2, wherein the first voltage is a power supply voltage, and the second voltage is a ground voltage.

5. The semiconductor device of claim 2, wherein the first voltage is a ground voltage, and the second voltage is a power supply voltage.

6. The semiconductor device of claim 2, wherein the semiconductor substrate further comprises a second pad electrode which is provided in a central region on the semiconductor substrate, and the second pad electrode is connected to the second ball electrode through the contact wiring line.

7. The semiconductor device of claim 2,
wherein the semiconductor substrate further comprises a second pad electrode which is provided in a central region on the semiconductor substrate, and
the second pad electrode is connected to the third ball electrode through the contact wiring line.

8. The semiconductor device of claim 1, wherein any one of the plurality of first ball electrodes is connected to a plurality of the first pad electrode positioned below the corresponding ball electrode.

9. The semiconductor device of claim 1, further comprising a connecting electrode being disposed between the first ball electrode and the contact wiring line, and electrically connects the first ball electrode and the contact wiring line,
wherein an area of a bottom surface of the connecting electrode is set to be larger than an area of a top surface of the first pad electrode.

10. The semiconductor device of claim 1, further comprising a connecting electrode being disposed between the first ball electrode and the contact wiring line, and electrically connects the first ball electrode and the contact wiring line,
wherein an area of a bottom surface of the connecting electrode is set to be larger than an area of a top surface of the contact wiring line, the top surface of the contacting wiring being connecting to the bottom surface of the connecting electrode.

11. The semiconductor device of claim 1, wherein a second ball electrode among the plurality of ball electrodes is provided in a central region on the semiconductor substrate, the second ball electrode being connected to the pad electrodes positioned below the second ball electrode.

12. A semiconductor device, comprising:
a semiconductor substrate which has a plurality of pad electrodes provided on a top surface thereof and has an approximately rectangular shape;
a rewiring layer which is provided with a plurality of contact wiring lines connected to the plurality of pad electrodes, is disposed on the semiconductor substrate through an insulating film, and has an approximately rectangular shape; and
a plurality of ball electrodes which are provided on the rewiring layer,
wherein a plurality of first pad electrodes among the plurality of pad electrodes are arranged on an outer circumference of the semiconductor substrate to be along a first side of the semiconductor substrate, and
the rewiring layer is provided with:
a first rewiring line to connect a first ball electrode positioned among the plurality of ball electrodes at a central region on the rewiring layer and applied with a first voltage, among the plurality of ball electrodes, and the first pad electrode supplied with the first voltage, among the plurality of first pad electrodes, a second rewiring line to connect the second ball electrode positioned at the central region on the rewiring layer and applied with a second voltage, among the plurality of ball electrodes, and a second pad electrode supplied with the second voltage, among the plurality of first pad electrodes, and outer circumference wiring lines to be disposed on the outer circumference of the rewiring layer along the first side to be positioned closer to an outer boundary of the rewiring layer than a region of the rewiring layer directly on the first pad electrodes and connected to the first rewiring line.

13. A semiconductor device, comprising:

a semiconductor substrate which has a plurality of pad electrodes provided on a top surface thereof and has an approximately rectangular shape;

a rewiring layer which is provided with a plurality of contact wiring lines connected to the plurality of pad electrodes, is disposed on the semiconductor substrate through an insulating film; and a plurality of ball electrodes which are provided on the rewiring layer, wherein a plurality of first pad electrodes among the plurality of pad electrodes are arranged on an outer circumference of the semiconductor substrate to be along a first side of the semiconductor substrate, a plurality of first ball electrodes among the plurality of ball electrodes are arranged on an outer circumference of the rewiring layer to be along the first side, and the semiconductor device further comprises outer circumference wiring lines to be disposed on the outer circumference of the rewiring layer along the first side, the outer circumference wiring lines being outside from the first pad electrodes towards the first side.

* * * * *